United States Patent
Ando et al.

[11] Patent Number: 5,308,781
[45] Date of Patent: May 3, 1994

[54] SEMICONDUCTOR MEMORY DEVICE

[75] Inventors: Yuichi Ando, Takarazuka; Koichi Sogawa, Minoo; Norio Yoshida, Ikeda; Masao Kiyohara, Takarazuka, all of Japan

[73] Assignee: Ricoh Company, Ltd., Tokyo, Japan

[21] Appl. No.: 4,176

[22] Filed: Jan. 13, 1993

Related U.S. Application Data

[62] Division of Ser. No. 702,272, May 17, 1991, abandoned.

[30] Foreign Application Priority Data

May 21, 1990 [JP] Japan .................. 2-132058
Jul. 27, 1990 [JP] Japan .................. 2-199864
Feb. 25, 1991 [JP] Japan .................. 3-053920

[51] Int. Cl.⁵ .................. H01L 21/265; H01L 27/02
[52] U.S. Cl. .................. 437/48; 437/52; 437/41; 437/238; 437/244; 257/333; 257/390; 257/394; 148/DIG. 116; 148/DIG. 163
[58] Field of Search .................. 357/41, 45, 46, 52, 357/67 S; 437/48, 52, 41, 238, 244; 148/DIG. 116, DIG. 163; 257/333, 390, 394

[56] References Cited

U.S. PATENT DOCUMENTS 5,023,682  6/1991  Shimizu et al. .................. 357/67 S

FOREIGN PATENT DOCUMENTS

| 139667 | 8/1984 | Japan | H01L 27/10 |
| 59-139667 | 8/1984 | Japan | . |
| 139668 | 8/1984 | Japan | H01L 27/10 |
| 287164 | 12/1986 | Japan | H01L 27/10 |
| 288464 | 12/1986 | Japan | H01L 27/10 |
| 67857 | 3/1987 | Japan | H01L 27/10 |
| 96953 | 4/1988 | Japan | H01L 27/10 |
| 63-96953 | 4/1988 | Japan | . |

Primary Examiner—Edward Wojciechowicz
Attorney, Agent, or Firm—Cooper & Dunham

[57] ABSTRACT

A semiconductor memory device comprising a substrate, a longitudinal source diffusion layer for a plurality of memory transistor source regions continuously formed on the substrate, and a longitudinal drain diffusion layer for a plurality of memory transistor drain regions continuously formed on the substrate in parallel to the source diffusion layer. A word line is formed crossing over the diffusion layers. And an electrically insulating film is interposed between the word line and the diffusion layers. The insulating film is thicker than a gate oxide film formed between the diffusion layers.

6 Claims, 9 Drawing Sheets

SEMICONDUCTOR MEMORY DEVICE

This is a division of application Ser. No. 07/702,272 filed May 17, 1991, now abandoned.

BACKGROUND OF THE INVENTION

1. Field of the Invention

The present invention relates to a semiconductor memory device having a planar cell structure.

2. Description of the Related Art

In general, an MOS type semiconductor integrated circuit device is formed in such a way that a field oxide film is used for device isolation and that a source region and a drain region are formed by diffusing impurities in a substrate by a self-alignment method with the use of a gate electrode as a mask. One or two contacts are required for connecting the source region and the drain region per one transistor. Therefore, space is needed for margine for the contacts and wiring, which impedes the realization of a minute and compact device.

In order to improve this point, a semiconductor integrated circuit device having a planar cell structure has been proposed in Japanese Patent Application Laying Open (KOKAI) Nos. 61-288454 and 63-96953, for example.

In the planar cell structure, a first continuous diffusion area for a plurality of MOS transistor source regions and a second continuous diffusion area for a plurality of MOS transistor drain regions are formed in parallel to each other on a substrate. A word line is formed on the substrate crossing over the first and second diffusion areas through an electrically insulating film.

In accordance with the planar cell structure, it becomes unnecessary to form a field oxide film for device isolation. Also, the source region and the drain region are formed in common to a plurality of MOS transistors. Therefore, only one contact is needed for several or more transistors, which makes it possible to realize a compact IC device of high density.

In the planar cell structure, it is desirable that a relatively thick insulating film be formed on the diffusion areas since the word line is formed crossing over the diffusion areas for the source and drain regions. This is because if the insulating film is thin, the capacity between the diffusion area and the word line, resulting that the functional speed is lowered.

To the contrary, however, with respect to the channel region, the gate oxide film have to be thin to make the structure minute and compact and obtain a high speed function thereof.

In accordance with the planar cell structure, the resistance of the bit line becomes high, since the bit line is constituted from the continuous diffusion layer in common to a plurality of memory transistors. The transmission speed of a memory signal of a memory device is determined from the product of the bit line resistance and the capacity. Therefore, it is one way to lower the resistance of the bit line in order to raise the transmission speed of the memory signal.

SUMMARY OF THE INVENTION

It is therefore an object of the present invention to provide a semiconductor memory device having a planar cell structure which makes it possible to function the device at a high speed by decreasing the capacity between the word line and the diffusion layers for source and drain regions or lowering the resistance of the bit line.

The above-mentioned object of the present invention can be achieved by a semiconductor memory device comprising:

a substrate;

a longitudinal source diffusion layer for a plurality of memory transistor source regions continuously formed on the substrate;

a longitudinal drain diffusion layer for a plurality of memory transistor drain regions continuously formed on the substrate in parallel to the source diffusion layer;

a word line crossing over the diffusion layers; and an electrically insulating film interposed between the word line and the diffusion layers, the insulating film being thicker than a gate oxide film formed between the diffusion layers.

If a thick insulating film is interposed between the diffusion layer and the word line, the capacity therebetween becomes small. Also, if a silicide layer is formed on the diffusion layer to constitute the bit line, the resistance of the bit line becomes small. Both arrangements can promote the functional speed of the device.

An advantage of the above-mentioned construction of the memory device in accordance with the present invention is that it becomes possible to reduce the parasitic capacity between the diffusion layer and the word line to raise the functional speed of the device due to the arrangement of a thick electrically insulating film interposed between the diffusion layer and the word line formed in the planar cell structure.

Another advantage of the above-mentioned arrangement of the present invention is that the reliability of insulation is increased between the diffusion layer and the word line.

Still another advantage of the memory device in accordance with the present invention is that when the insulating film between the diffusion layer and the word line includes a film formed by a CVD method, since the film thickness can be easily controlled by the CVD method, it becomes possible to obtain an optimal parasitic capacity between the diffusion layer and the word line as a result of which the characteristic and reproducibility of the memory device are upgraded.

A further advantage of the memory device in accordance with the present invention is that the resistance of the bit line sheet is lowered to about 3 Q by forming a silicide layer on the diffusion layer surface of the bit line, which also makes it possible to raise the functional speed of the memory device.

Further objects and advantages of the present invention will be apparent from the following description of the preferred embodiments of the invention as illustrated in the accompanying drawings.

DESCRIPTION OF THE PREFERRED EMBODIMENTS

Figure 1:
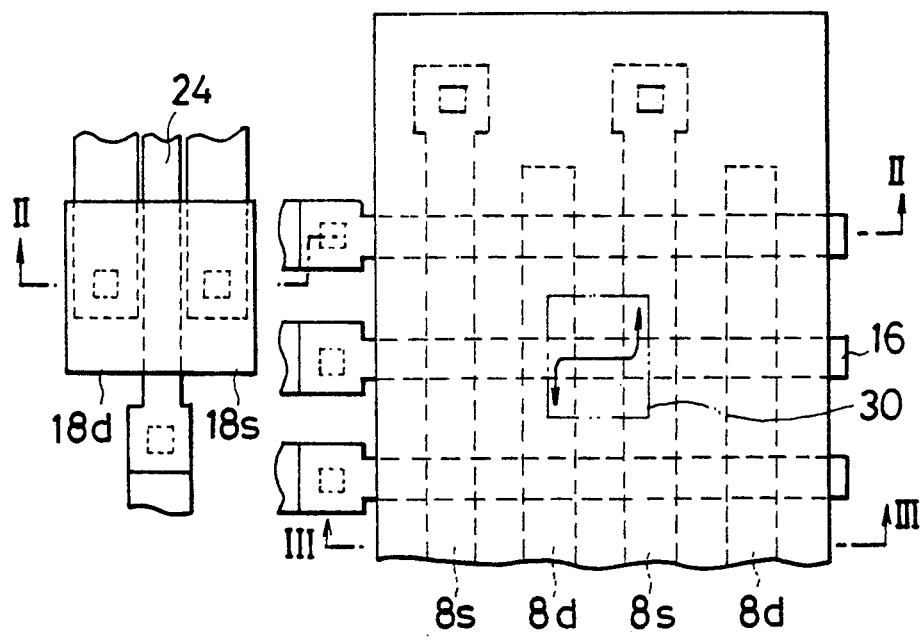
FIG. 1 is a plan view of an embodiment of the memory device in accordance with the present invention.
Figure 2:
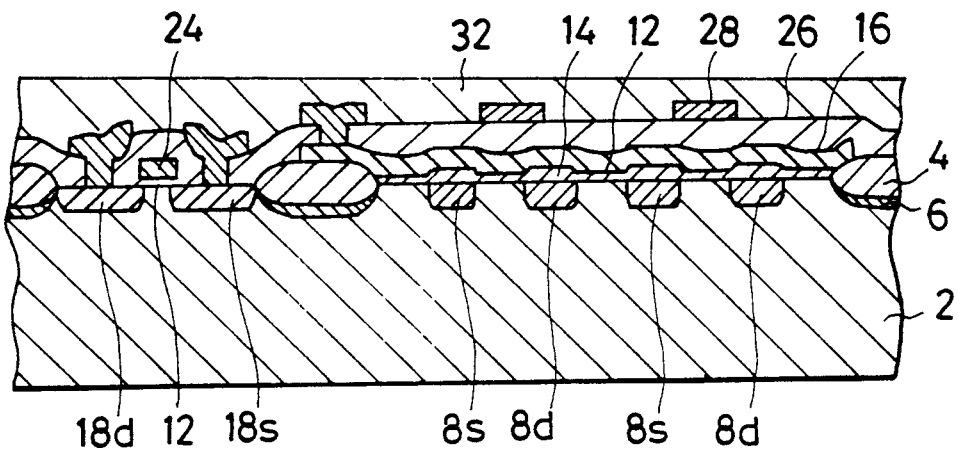
FIG. 2 is a sectional view of the memory device of FIG. 1 taken along the line A-A' in FIG. 1.
Figure 3:
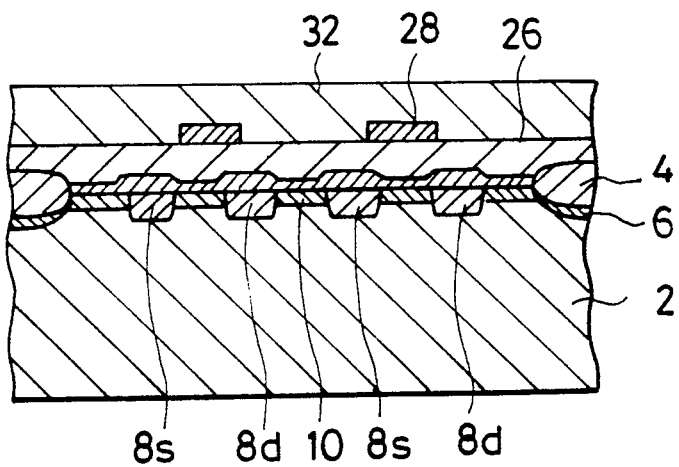
FIG. 3 is a sectional view of the memory device of FIG. 1 taken along the line B-B' in FIG. 1.

FIGS. 1 to 3 illustrate an embodiment of the semiconductor memory device in accordance with the present invention. FIG. 1 is a plan view of the device and FIGS. 2 and 3 are sectional views taken along the lines II—II and III—III, respectively. Note that in FIG. 1, interlayer insulators, metal wirings and passivation films are not depicted for the sake of simplifying the drawing.

In FIGS. 1 and 2, the left side of the drawing represents a region for a peripheral transistor and the right side of the drawing represents a region for a memory transistor.

Numeral 2 designates a P-type silicon substrate on which a field oxide film 4 and a channel stop layer 6 are formed to isolate the peripheral transistor region from the memory transistor region and also isolate the peripheral transistors from each other.

First, the memory transistor region is described below.

Source regions 8s and drain regions 8d are formed on the substrate in parallel to each other. Each region 8s, 8d is formed by an N-type diffusion layer of strip shape and used for constituting a plurality of memory transistors.

On the substrate 2 are formed a plurality of word lines 16 crossing perpendicularly over the source and drain regions 8s and 8d through a gate oxide film 12 of 100 to 500 Å thick or a thick silicon oxide film 14 of 500 to 2000 Å thick. The word line 16 is constituted from a polycrystalline silicon layer and functions not only as a word line but as a gate electrode as well. A channel region is formed between the diffusion layers 8s and 8d and under the word line 16.

A P-type diffusion layer 10 is formed on the substrate 2 in the portion where the layers 8s, 8d and the channel layer are not formed by introducing P-type impurities such as boron into the substrate 2. The source region 8s and the drain region 8d are separated and isolated from each other by the layer 10 except in the regions of channel. The source regions 8s and the drain regions 8d are disposed alternately.

Next, the peripheral transistor region (left side portion in FIG. 2) is described below.

A source region 18s and a drain region 18d are formed on the substrate 2. Each region 18s, 18d is constituted from an N-type diffusion layer. A gate electrode 24 is formed through a gate oxide film 12 on the channel region which is defined by the region between the source and drain regions 18s and 18d.

An interlayer insulator 26 is formed on the substrate 2, the word lines 16 and the gate electrodes 24. Metal wirings 28 are arranged on the insulator 26. The wirings 28 are connected to the diffusion layers, the word lines and the gate electrodes through contact holes formed through the insulator 26. Numeral 32 designates a passivation film.

In the memory transistor region of FIG. 1, the rectangular area 30 defined by a dash-dot line represents one memory transistor. The threshold value of each transistor is adjusted and set by ion implantation in order to determine the ROM code thereof. The threshold value is raised by implanting boron, for example, in the channel region of the memory transistor 30. Or the threshold value is kept being low by not implanting impurities in the channel region.

In the event that a word line 16 of the transistor 30 is selected and voltage is applied thereto, if the threshold value is low, current flows from the drain region (bit line) 8d to the source region 8s. On the other hand, if the threshold value is high, current does not flow so that the data memorized in the ROM can be read by a sensing circuit connected to the bit line 8d.

In this particular embodiment, the silicon oxide film 14 is disposed as a thick insulating layer between the word line 16 and each of the diffusion layers 8s and 8d. The film 14 may be formed either by the oxidation enhanced method simultaneously with the gate oxide film 12 or by the selective oxidation method.

An example of process for producing the above-mentioned embodiment of the memory device in accordance with the present invention is described hereinafter with reference to FIGS. 4a to 4e.

(Step A)

Figure 4A:
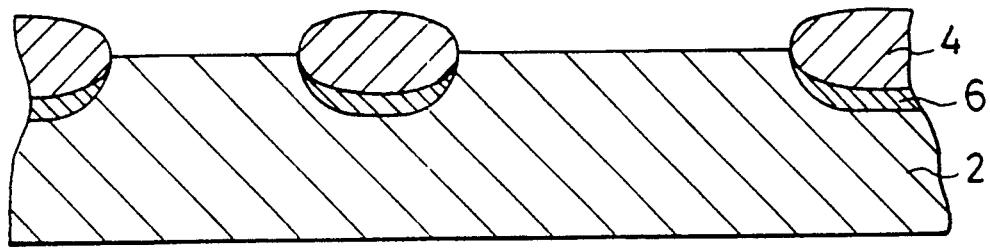
FIGS. 4a to 4e are sectional views of the memory device in different steps of an embodiment of the process of producing the device of FIG. 1 according to the present invention representing a flow chart in series in this order.

A channel stop layer 6 and a field oxide film 4 are formed on the P-type silicon substrate 2 so as to constitute a channel dope layer, as illustrated in FIG. 4a.

(Step B)

Figure 4B:
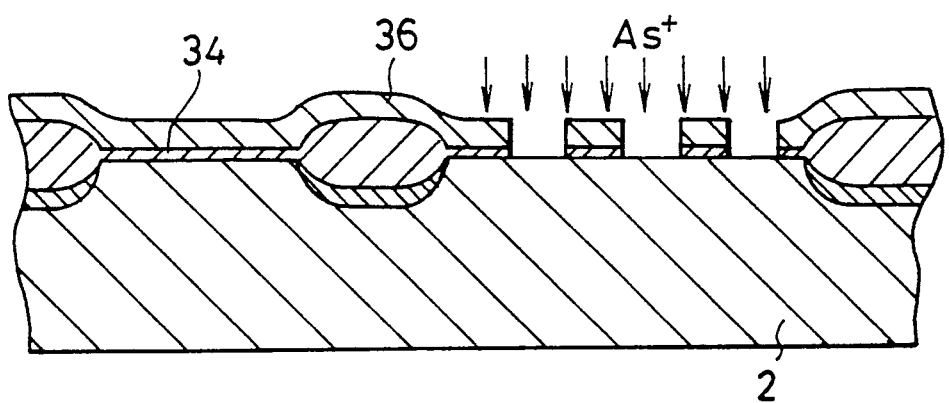

A pregate oxide film 34 is formed on the substrate, as illustrated in FIG. 4b. After that, a resist pattern 36 is formed photolithographically which pattern has openings corresponding to the source region and the drain region of the memory transistor. The oxide film 34 is etched through the resist pattern 36. After that, N-type impurities consisting of phosphorus or arsenic are implanted. Conditions of implantation are such that the density of impurities is about $10^{18}$ to $10^{20}$/cm and the implantation energy is about 30 to 200 KeV.

(Step C)

The resist 36 and the pregate oxide film 34 are removed. After that, a thermal oxidation process is conducted to cure the damage caused by the implantation and to form a interlayer 14 between the word line and the diffusion layers of source and drain regions as well as the gate oxide film of the peripheral transistor and the memory transistor.

Conditions of the thermal oxidation process is as follows.

Figure 4C:
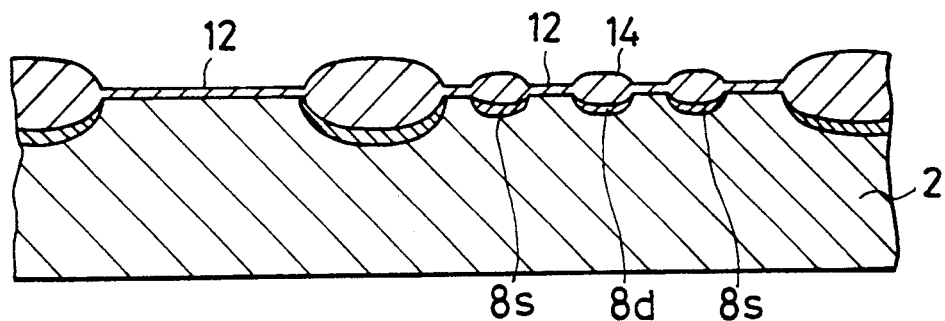

The process is started at a temperature of about 800° C. in a nitrogen atmosphere of flow rate of 18 l/min. A preoxidation process is conducted for about 15 minutes at a temperature of about 800° C. in an atmosphere of nitrogen (flow rate 3 l/min), oxygen (flow rate 10 l/min) and hydrogen (flow rate 10 l/min). After that, the temperature is raised to about 920° C. and oxidation process is conducted for about 10 minutes under the same condition as the preoxidation process, that is, in the atmosphere of nitrogen (flow rate 3 l/min), oxygen) flow rate 10 l/min) and hydrogen (flow rate 10 l/min). After that, the temperature is lowered to about 800° C. and the atmosphere is restored to nitrogen of 18 l/min to end the oxidation process. By this oxidation process, a gate oxide film 12 is formed on the silicon substrate in the region other than the diffusion area. When the gate oxide film 12 is about 100 to 500 Å thick, the oxidation process on the diffusion layers 8s and 8d is enhanced to form a thick oxide film 14 of about 500 to 2000 Å thick, as illustrated in FIG. 4c.

(Step D)

Figure 4D:
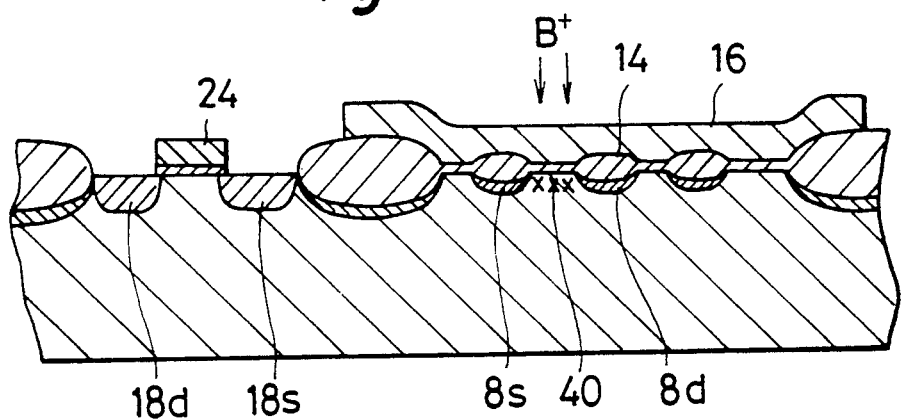
Figure 4E:
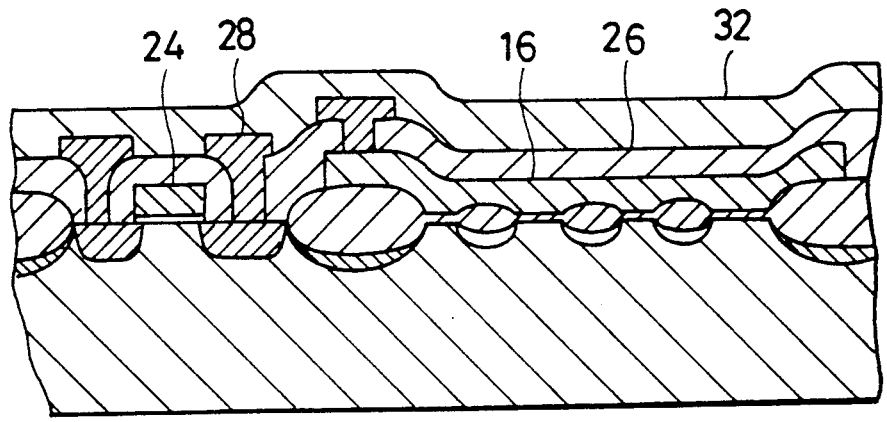

A polycrystalline silicon layer is formed on the layered structure which silicon layer is photolithographed and etched to form patterns of word line 16 and gate electrode 24, as illustrated in FIG. 4d. Since the thick oxide film 14 is formed on the diffusion layers 8s and 8d, the word line 16 is reliably insulated from the diffusion layers 8s and 8d. Also, the parasitic capasity of the word line 16 becomes small.

After that, N-type impurities consisting of phosphorus or arsenic are implanted in the peripheral transistor region to form diffusion layers 18s and 18d. The conditions of implantation are the same as in the case of producing an ordinary MOS transistor. Boron, for instance, is implanted for arranging ROM code. Numeral 40 (FIG. 4d) designates a core implantation area.

After that, a heat treatment and oxidation process are conducted, which cures the damage of the layered structure due to the implantation and by which the oxide films are thickened due to the oxidation enhanced effect since the impurities of high density are implanted in the diffusion layers 8s, 8d, 18s and 18d, the word line 16 and the gate electrode 24. After that, P-type impurities are implanted in the structure by an ion implantation method or a diffusion method. The impurities are not implanted in the portion where the thick oxide film is formed. Whereas the impurities are implanted in the memory transistor area of the substrate in the portion other than the word line 16 and the diffusion layers 8s and 8d are formed so that the diffusion layers 8s and 8d are isolated from each other.

(Step E)

An interlayer insulator 26 is formed on the structure. Contact holes are formed in the insulator 26 penetrating therethrough through which contact holes metal wirings are arranged. After that, a passivation film 32 is formed on the layered structure to finish the process.

In accordance with the process for forming the planar cell structure, the gate oxide layer is formed after the source and drain diffusion layers are formed by implanting the impurities. Therefore, there arises a problem of outdiffusion, that is, the impurities intrude into the channel region from the diffusion regions 8s and 8d. If the outdiffusion occurs, the channel region is contaminated and the threshold value is changed.

On the other hand, in accordance with the thermal oxidation step C of FIG. 4c mentioned above, the oxidation process starts at a state of low temperature so that the diffusion layers 8s and 8d are covered by an oxide film. After that, the oxidation process is conducted at a high temperature wherein the impurities are prevented from getting out of the diffusion layers 8s and 8d because of the oxide film formed on the layers 8s and 8d, which means that the outdiffusion is prevented or attenuated.

Another example of the process for producing the memory device of FIG. 1 in accordance with the present invention is described hereinafter with reference to FIGS. 5a to 5e.

(Step A)

Figure 5A:
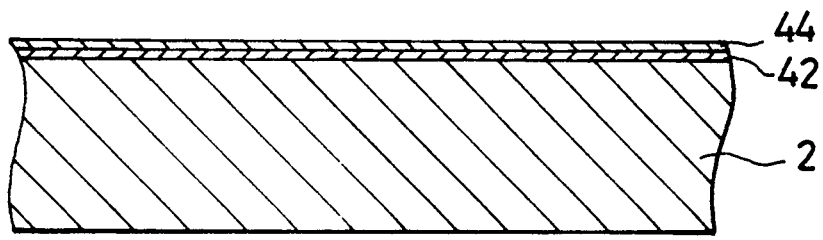
FIGS. 5a to 5e are sectional views of the memory device in different steps of another embodiment of the process of producing the device of FIG. 1 according to the present invention representing a flow chart in series in this order.

On a P-type silicon substrate 2, a buffer oxide film 42 of 250 Å thick is formed. A silicon nitride film 44 is deposited on the film 42 to about 1000 Å thick, as illustrated in FIG. 5a.

(Step B)

Figure 5B:
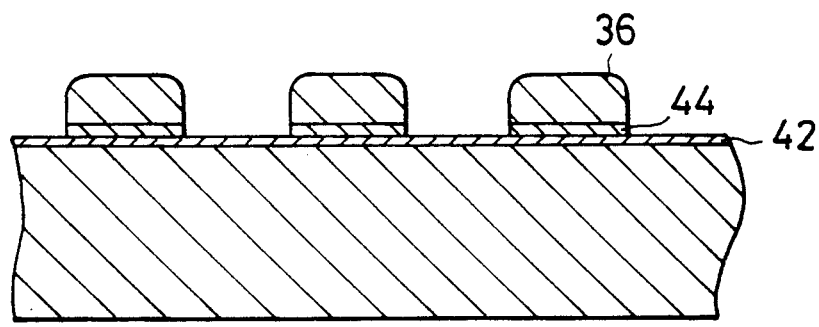

A resist pattern 36 for forming the source and drain of the memory transistor is formed by a photolithographic process and the silicon nitride film 44 is etched with the use of the resist pattern 36 as a mask to form a layered structure of FIG. 5b.

(Step C)

Figure 5C:
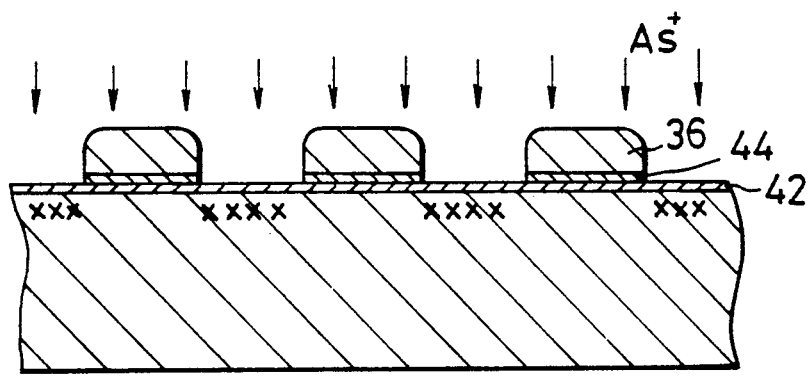

Ion implantation process is conducted with the use of N-type impurities of phosphorus or arsenic to form a memory diffusion layer using the resist pattern 36 as a mask, as illustrated in FIG. 5c. Conditions of ion implantation are such that if arsenic is used, the implantation energy is about 30 to 200 KeV and that the density of ion is about $10^{18}$ to $10^{20}$/cm$^2$.

(Step D)

Figure 5D:
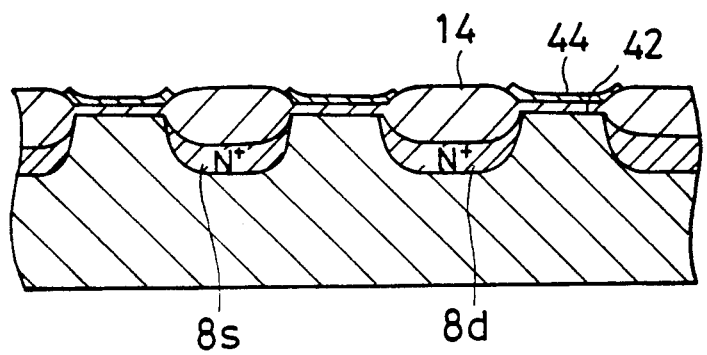

The layered structure is oxidized after the resist 36 is removed. In this oxidation process, the portion where the structure is not covered by the film 44 is selectively oxidized to form a thick silicon oxide film 14, as illustrated in FIG. 5d, whereas the portion where the structure is covered by the film 44 is not oxidized. In this process, N-type diffusion layers of source 8s and drain 8d are formed by the function of anneal drive of the implanted N-type impurities.

It is to be noted that the field oxide film is selectively formed simultaneously with the oxide film 14 formed by the selective oxidation process mentioned above.

(Step E)

Figure 5E:
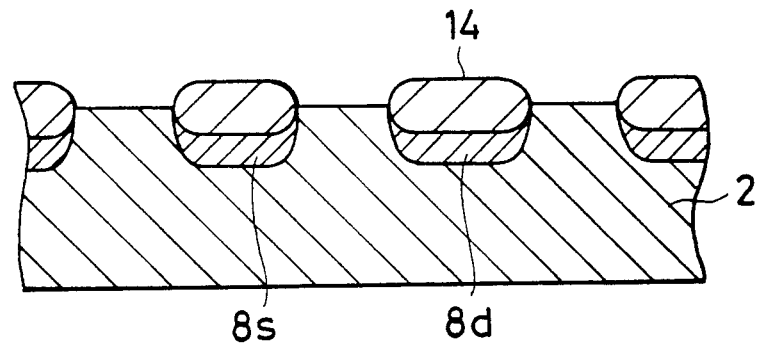

The silicon nitride film 44 and the buffer oxide film 42 are removed as illustrated in FIG. 5e. After that, a channel dope layer is formed and a gate oxide film is formed by a gate oxidation process.

After that, as in the same manner as the process of FIGS. 4, a polycrystalline silicon layer is formed which layer is patterned to form word lines and gate electrodes. After that, the memory device is completed by the same process as the example of FIGS. 4.

In accordance with the process of FIGS. 5a to 5e, it becomes possible to form a thick silicon oxide film on the diffusion layers of source and drain of the memory transistor, the oxide film being self-aligned with the diffusion layers.

Also, in the process for producing the gate oxide film, the outdiffusion from the areas 8s and 8d does not arise since the silicon oxide film 14 is formed beforehand on the impurities diffusion areas, which enables to give a stable and even threshold voltage for transistors.

Further, in accordance with the process of FIGS. 5a to 5e, it becomes possible to desirably adjust the thickness of the film 14 formed on the diffusion layers.

Figure 6:
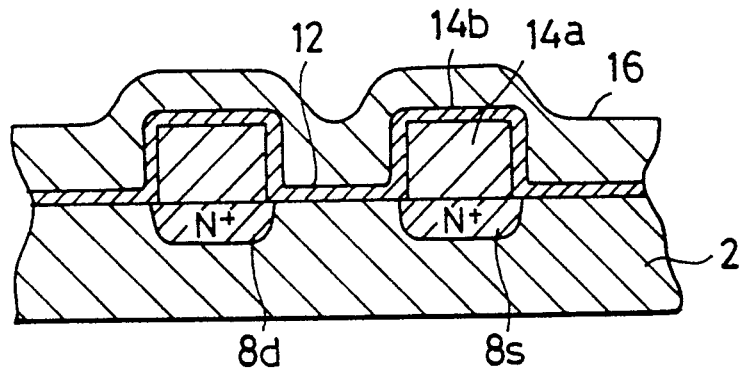
FIG. 6 is a sectional view of a main portion of another embodiment of the memory device in accordance with the present invention.

FIG. 6 illustrates a second embodiment of the memory device in accordance with the present invention. This embodiment comprises a thick insulation film formed by a CVD method between the word line 16 and the diffusion layers 8s and 8d for the source and drain of the transistor.

In FIG. 6, reference 14a designates a silicon nitride film ($Si_3N_4$) of about 3000 Å thick formed by a CVD method on the diffusion layers 8s and 8d. An oxide film 14b is further formed on the film 14a at the time of gate oxidation process. Numeral 12 designates a gate oxide film.

Due to the structure wherein the thick insulating film is formed on the diffusion layers 8s and 8d by a CVD process, it becomes possible to easily control the thickness of the film and raise the reproducibility of the film with a desired thickness.

A process for producing the embodiment of FIG. 6 is described hereinafter with reference to FIGS. 7a to 7e.

(Step A)

Figure 7A:
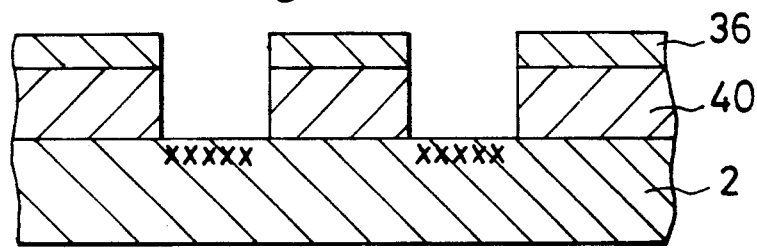
FIGS. 7a to 7e are sectional views of the memory device in different steps of an embodiment of the process of producing the device of FIG. 6 according to the present invention representing a flow chart in series in this order.

On a P-type silicon substrate 2, a channel stop layer and a field oxide film are formed to constitute a channel dope layer, in the same manner as the process of FIGS. 4. After that, the surface of the substrate 2 is oxidized to form a silicon oxide film 40 of about 3000 Å thick. After that, as in the case of FIGS. 4, a resist pattern 36 is formed by a photolithographic technique to form the source and drain regions of the memory transistor. After that, the film 40 is etched to remove the portion thereof corresponding to the diffusion areas, as illustrated in FIG. 7a.

After that, N-type impurities of phosphorus or arsenic are implanted.

(Step B)

Figure 7B:
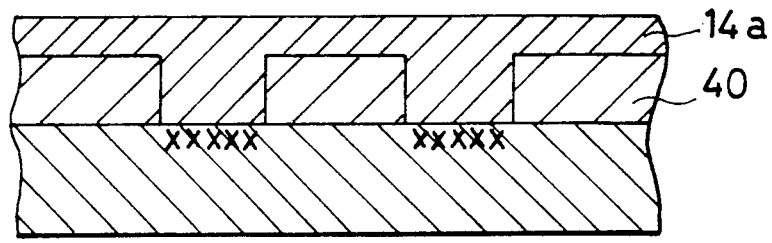

After the resist 36 is removed, a silicon nitride film 14a is deposited to about 4000 Å thick by a CVD process, as illustrated in FIG. 7b.

(Step C)

Figure 7C:
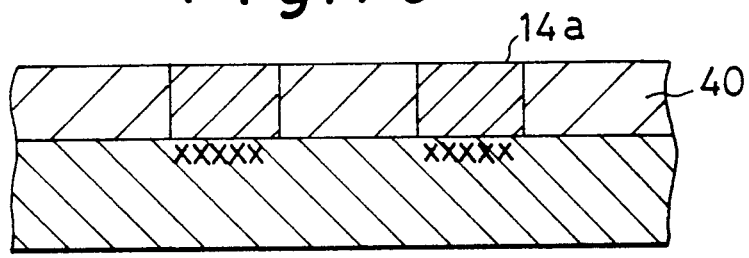

The film 14a is etched leaving the film in the openings of the film 40 by an etching back method, as illustrated in FIG. 7c.

(Step D)

Figure 7D:
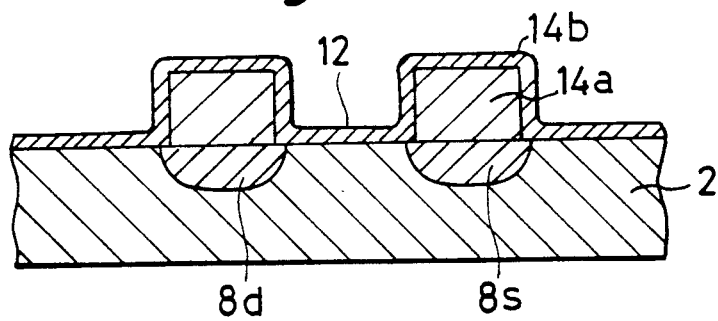
Figure 7E:
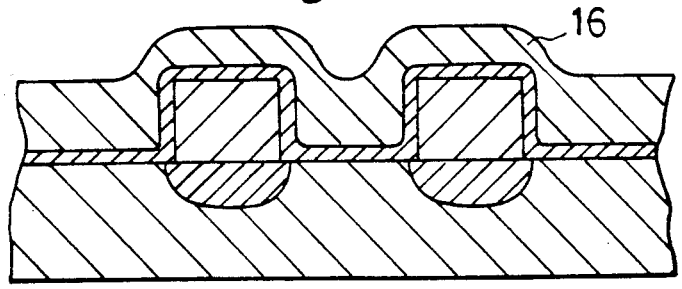

The film 40 is etched and removed. After that, a gate oxide film 12 is formed, as illustrated in FIG. 7d. The oxide film 14b is also formed on the film 14a. In this process, the N-type impurities doped by the ion implantation method are diffused to form the source and drain diffusion layers 8s and 8d.

(Step E)

A polycrystalline silicon layer is formed in the same manner as the process of FIGS. 4. The silicon layer is patterned to form a word line 16 and gate electrodes. In accordance with this arrangement, a thick insulating layer consisting of the film 14a of about 3000 Å thick and the thin film 14b is interposed between the word line 16 and the diffusion layers 8s and 8d. Due to the arrangement of this thick insulating layer, it becomes possible to guarantee the reliable insulation between the word line 16 and the diffusion layers 8s and 8d and reduce the parasitic capasity of the word line 16 as well.

After that, the device is processed in the same way as the process of FIGS. 4 to complete the memory device.

Figure 8:
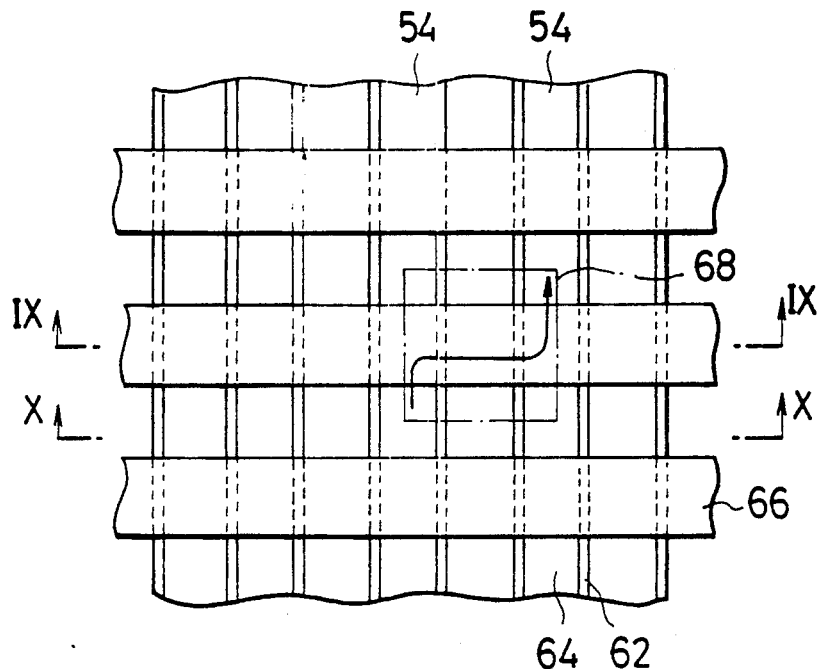
FIG. 8 is a plan view of a main portion of still another embodiment of the memory device in accordance with the present invention.

FIG. 8 illustrates a third embodiment of the memory device in accordance with the present invention.

Figure 9:
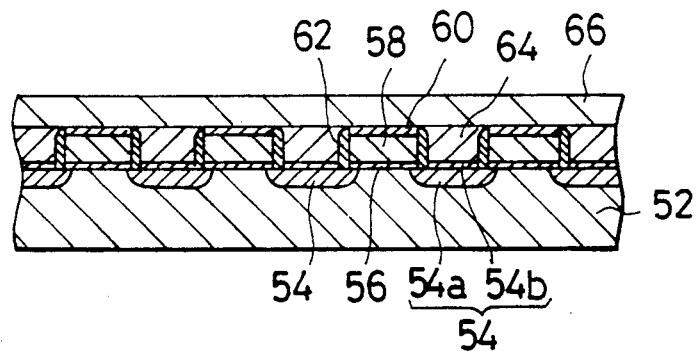
FIG. 9 is a sectional view of the memory device taken along the line A-A' in FIG. 8.
Figure 10:
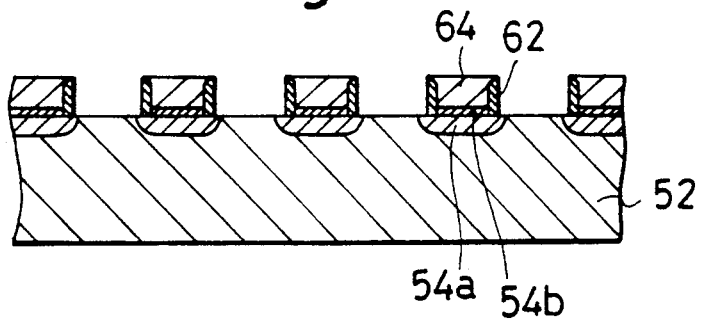
FIG. 10 is a sectional view of the memory device taken along the line B-B' in FIG. 8.

FIGS. 9 and 10 illustrate sectional views of the memory device of FIG. 8 taken along the lines IX—IX and X—X, respectively.

In the drawings, the interlayer insulator, metal wirings and the passivation film are deleted for the sake of simplifying the drawings. Also, only the memory transistor area is illustrated in the drawings. However, in general, peripheral transistors are formed in the same chip. The structure of the peripheral transistor per se in this particular embodiment is the same as the prior art structure, therefore the explanation thereof is deleted.

Numeral 52 designates a P-type silicon substrate. The memory transistor area is isolated from the peripheral transistor area by the field oxide film and the channel stop layer. Numeral 54 designates a bit line which is composed of an N-type diffusion layer 54a and a titanium silicide ($TiSi_2$) layer 54b. The bit lines 54 are arranged in parallel to each other in the vertical direction in the sheet of FIG. 8.

A gate oxide film 56 is arranged between every two adjacent bit lines 54 for each memory transistor. A gate electrode 58 is formed on the film 56. The gate electrode 58 is composed of a polycrystalline silicon layer doped with phosphorus to reduce the resistance thereof. A titanium silicide layer 60 is also formed on the electrode 58. A silicon oxide film 62 is formed on each side wall of the electrode 58. The bit line 54 is insulated from the electrode 58 by the films 62 and 56. The gate electrode 58 is independently patterned for each memory transistor. With respect to the direction perpendicular to the longitudinal direction of the bit line 54 (lateral direction in the sheet of FIG. 8), the space between the adjacent two electrodes 58 is filled with a PSG (Phospho-Silicate Glass) film 64.

On the electrodes 58 and 60 and the film 64, word lines 66 are formed in a pattern of strips arranged in parallel to each other perpendicularly to the longitudinal direction of the bit line 54. The word line 66 is constituted from tungsten silicide ($WSi_2$), for instance.

The bit line 54 is isolated in such a way that P-type impurities of boron, for instance, are implanted in the substrate 52 to form P-type diffusion layers exept in the portion where the bit line 54 and the word line 66 are formed. The bit lines 54 of the source and drain are arranged alternately along the longitudinal direction of the word line 66.

An interlayer insulator (not shown) is formed on the substrate 52 and the word line 66. Also, metal wirings (not shown) are arranged on the interlayer insulator which has contact holes penetrating therethrough. The metal wirings are connected to the bit lines 54 and the word lines 66 through the contact holes of the interlayer insulator. On the metal wirings is further formed a passivation film.

In FIG. 8, the rectangular region 68 defined by the dash-dot line represents one memory transistor. Ions are implanted in each transistor region to set the threshold value of the memory transistor to determine the ROM code thereof. The data of ROM is read by the same way as in the case of the device of FIG. 1 using the memory cell 30.

Figure 11:
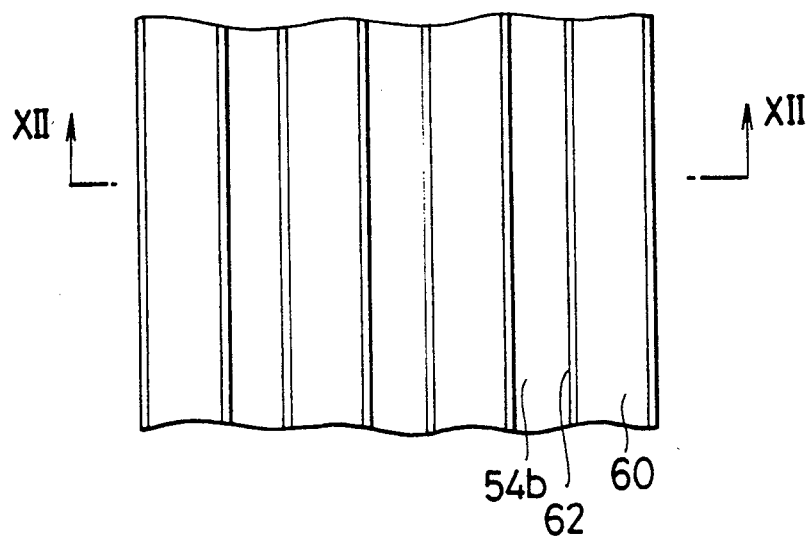
FIG. 11 is a plan view of a main portion of the memory device in a middle step of a process for producing the device of FIG. 8.
Figure 12:
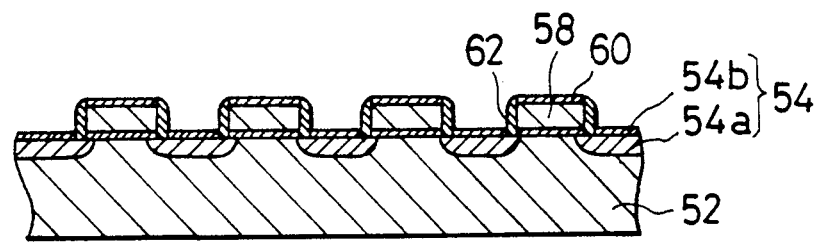
FIG. 12 is a sectional view of the memory device of FIG. 11 taken along the line C-C' in FIG. 11.
Figure 13:
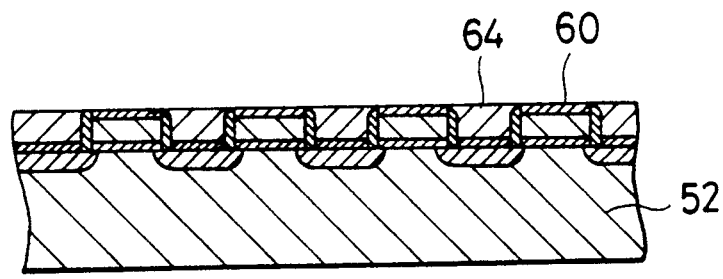
FIG. 13 is a sectional view of the memory device of FIG. 8 in a middle step of another process for producing the device of FIG. 8.

A process for producing the above-mentioned third embodiment of the memory device is described hereinafter with reference to FIGS. 11 to 13.

The peripheral transistors are formed simultaneously with the memory transistor. However, the process for producing the peripheral transistors per se in this particular embodiment is the same as the prior art process, therefore the explanation thereof is deleted.

(Step A)

On the P-type silicon substrate 52 is formed a gate oxide film to about 250 Å thick. After that, a channel doping process is conducted to determine the threshold value of the memory transistor.

(Step B)

A polycrystalline silicon layer is deposited to about 4000 Å thick. After that, phosphorus is deposited on the layer and diffused therein to reduce the resistance of the layer. The resistance of the polycrystalline silicon sheet doped with phosphorus is about 100 Ω.

(Step C)

The polycrystalline silicon layer and the gate oxide film are patterned to form parallel strips.

(Step D)

A silicon oxide is deposited and then etched back so that the oxide remains on the side walls of the strip pattern of the polycrystalline silicon layer.

(Step E)

Arsenic is doped to form bit lines using a mask constituted from the strip pattern of the polycrystalline silicon layer and the silicon oxide film formed on the side walls of the silicon layer. The arsenic implantation energy is about 30 to 200 KeV. And the implantation density is about $10^{18}$ to $10^{20}/cm^3$.

(Step F)

Titanium (Ti) is deposited on the layered structure and then thermal treatment is applied to the structure so that a silicide layer is formed on the bit lines and the polycrystalline silicon layer. FIGS. 11 and 12 represent this state. FIG. 12 is a sectional view of the structure taken along the line XII—XII in FIG. 11. In FIG. 12, the memory device comprises a P-type silicon substrate 52, an N-type diffusion layer 54a doped with arsenic, a titanium silicide layer 54b formed on the surface of the layer 54a, a polycrystalline silicon layer pattern 58, a titanium silicide layer 60 formed on the surface of the pattern 58 and a side wall silicon oxide film 62.

(Step G)

A PSG film is deposited on the structure and an SOG (Spin On Glass) film is formed on the surface of the structure to flatten the surface. After the structure is baked, the film is etched back until the layer 60 is revealed. This state is illustrated in FIG. 13.

(Step H)

A tungsten silicide layer is deposited on the structure and patterned by a photolithographic process and an etching process to form word lines 66 extending in the direction perpendicular to the longitudinal direction of the bit line 54 (see FIGS. 8 and 9). In this step, the layers 58 and 60 are also etched away except in the portion where the word lines 66 are formed.

(Step I)

Boron is implanted all over the structure to complete the isolation of the bit lines from each other.

After that, the structure is treated by an ordinary process to complete the memory device production.

In accordance with the process mentioned above including the steps represented in FIGS. 11 and 13, the bit lines are converted to silicide in a manner of self-alignment. The bit lines are formed after the gate oxidation step as a result of which the outdiffusion is suppressed, which makes it possible to realize a semiconductor memory device constituted from a planar cell structure having a qualified gate oxide film without contamination.

Also, the bit lines are formed in such a way that an insulating film is formed on each side wall of the gate electrode and after that impurities are doped with the use of the gate electrode along with the insulation film as a mask. Therefore, it becomes possible to form thin and minute bit lines as a result of which the size of the memory transistor can be reduced to, for example, 1.6 μm × 1.6 μm.

It is to be noted that the above-mentioned description refers to the embodiments of N-channel MOS transistor. However, the present invention can be applied to P-channel MOS transistors having a reversed conductive structure instead of the N-channel MOS transistor.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for producing a semiconductor memory device, said method comprising the steps of:

preparing a substrate;

forming longitudinal source diffusion layers for a plurality of memory transistor source regions continuously on said substrate;

forming longitudinal drain diffusion layers for a plurality of memory transistor drain regions continuously on said substrate in parallel to, alternately with and separately from said source diffusion layers;

forming gate oxide films on said substrate between said source and diffusion layers;

forming electrically insulating films on said source and drain diffusion layers at the same time as said step of forming gate oxide films, said electrically insulating films being thickened by an oxidation enhanced method to thereby be thicker than said gate oxide films; and forming word lines crossing over said source and drain diffusion layers.

2. A method according to claim 1, which further comprises a step of forming silicide layers on said source and drain diffusion layers.

3. A method for producing a semiconductor memory device, said method comprising the steps of:

preparing a substrate;

forming an oxide film, having a plurality of openings parallel to and separate from each other, for defining a plurality of memory transistor source and drain regions continuously on said substrate;

forming longitudinal source and drain diffusion layers for a plurality of memory transistor source and drain regions continuously on said substrate by introducing impurities through said openings into said substrate, said source and drain diffusion layers being formed in parallel to, alternately with and separately from each other;

depositing an electrically insulating film on said substrate by CVD method in such a manner that said openings are buried;

forming electrically insulating films, which have substantially the same thickness as said oxide film, on said source and drain diffusion layers by an etching back method;

removing said oxide film on said substrate;

forming gate oxide films on said substrate between said source and drain diffusion layers which are thinner than said oxide film; and forming word lines crossing over said source and drain diffusion layers.

4. A method according to claim 3, which further comprises a step of forming silicide layers on said source and drain diffusion layers.

5. A method for producing a semiconductor memory device, said method comprising the steps of:

preparing a substrate;

forming a gate oxide film on said substrate;

forming a doped polycrystalline silicon layer having a plurality of openings parallel to and separate from each other for defining a plurality of memory transistor source and drain regions continuously on said substrate;

forming oxide films on side walls of said polycrystalline silicon layer defining said openings;

forming longitudinal source and drain diffusion layers for a plurality of memory transistor source and drain regions continuously on said substrate by introducing impurities through said openings into said substrate, said source and drain diffusion layers being formed parallel to, alternately with and separately from each other;

depositing an electrically insulating film on said substrate by CVD method in such a manner that said openings are buried;

forming electrically insulating films on said source and drain diffusion layers by an etching back method;

forming word lines crossing over said source and drain diffusion layers; and removing the polycrystalline silicon layer except in a portion under the word lines.

6. A method according to claim 5, which further comprises a step of forming silicide layers on said source and drain diffusion layers.

* * * * *

UNITED STATES PATENT AND TRADEMARK OFFICE
CERTIFICATE OF CORRECTION

PATENT NO. : 5,308,781

DATED : May 3, 1994

INVENTOR(S) : Yuichi Ando, Koichi Sogawa, Norio Yoshida, and Masao Kiyohara

It is certified that error appears in the above-identified patent and that said Letters Patent is hereby corrected as shown below:

Column 10, line 34, (Claim 1), change "said source and diffusion layers" to —said source and drain diffusion layers—.

Signed and Sealed this

Fourth Day of August, 1998

*Attest:*

BRUCE LEHMAN

*Attesting Officer*   Commissioner of Patents and Trademarks